United States Patent
Stone et al.

(10) Patent No.: US 7,343,572 B1
(45) Date of Patent: Mar. 11, 2008

(54) VECTOR INTERFACE TO SHARED MEMORY IN SIMULATING A CIRCUIT DESIGN

(75) Inventors: Joshua Ian Stone, Santa Clara, CA (US); Jonathan B. Ballagh, Longmont, CO (US); Roger B. Milne, Boulder, CO (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 281 days.

(21) Appl. No.: 11/096,024

(22) Filed: Mar. 31, 2005

(51) Int. Cl.
*G06F 17/50* (2006.01)

(52) U.S. Cl. .................. 716/4; 716/5; 716/6; 703/14

(58) Field of Classification Search ............... 716/4–6; 703/14
See application file for complete search history.

(56) References Cited

U.S. PATENT DOCUMENTS

| | | | |
|---|---|---|---|
| 3,601,809 A | 8/1971 | Gray et al. | |
| 5,019,968 A * | 5/1991 | Wang et al. | 712/4 |
| 5,111,413 A * | 5/1992 | Lazansky et al. | 703/14 |
| 5,768,567 A | 6/1998 | Klein et al. | |
| 5,771,370 A | 6/1998 | Klein | |
| 5,870,588 A | 2/1999 | Rompaey et al. | |
| 6,026,421 A | 2/2000 | Sabin et al. | |
| 6,212,489 B1 | 4/2001 | Klein et al. | |
| 6,389,383 B1 | 5/2002 | Sarathy et al. | |
| 6,473,841 B1 | 10/2002 | Ueda et al. | |
| 6,651,225 B1 * | 11/2003 | Lin et al. | 716/4 |
| 6,701,501 B2 * | 3/2004 | Waters et al. | 716/8 |
| 6,754,763 B2 * | 6/2004 | Lin | 710/317 |
| 6,883,147 B1 * | 4/2005 | Ballagh et al. | 716/1 |
| 7,007,261 B1 * | 2/2006 | Ballagh et al. | 716/17 |
| 7,124,376 B2 * | 10/2006 | Zaidi et al. | 716/1 |
| 7,184,946 B2 | 2/2007 | Ballagh et al. | |
| 7,203,632 B2 | 4/2007 | Milne et al. | |
| 2002/0120909 A1 * | 8/2002 | Brouhard et al. | 716/5 |
| 2003/0144828 A1 * | 7/2003 | Lin | 703/21 |
| 2005/0165597 A1 | 7/2005 | Nightingale | |
| 2006/0174221 A1 * | 8/2006 | Kinsella et al. | 717/106 |

OTHER PUBLICATIONS

U.S. Appl. No. 10/949,049, filed Sep. 24, 2004, Milne et al.
U.S. Appl. No. 11/075,340, filed Mar. 8, 2005, Ballagh et al.

(Continued)

*Primary Examiner*—Vuthe Siek
*Assistant Examiner*—Naum Levin
(74) *Attorney, Agent, or Firm*—LeRoy D. Maunu

(57) ABSTRACT

A first block, a second block, a shared memory, and a third block are generated in a circuit design in response to user input control. The first block is coupled to the second block, the second block is coupled to the shared memory, and the shared memory is coupled to the third block in response to user input control. During one cycle of a simulation, the second block, in response to the first block, accesses a set of scalar values in the shared memory using scalar accesses. During one cycle of the simulation, the set of scalar values is transferred between the second block and the first block. During the simulation, the shared memory is accessed by the third block using scalar accesses.

17 Claims, 11 Drawing Sheets

OTHER PUBLICATIONS

Xilinx, Inc.; U.S. Appl. No. 11/095,282 by Milne et al.; filed on Mar. 31, 2005 by Xilinx. Inc.
FIFO Queing Discipline; [Verified by Wayback Machine, 2003]; pp. 1-3.
Miller, Lt. Rick; "C++ Arrays-Part 1"; [Verified by Wayback Machine, Apr. 2001]; pp. 1-4.
Huff, Reggie; "RAM is Not an Acronym"; [Verified by Wayback Machine, Jan. 2002]; pp. 1-5.

* cited by examiner

VECTOR INTERFACE TO SHARED MEMORY IN SIMULATING A CIRCUIT DESIGN

FIELD OF THE INVENTION

The present invention generally relates to simulating a circuit design and using a vector-based interface to access a shared memory.

BACKGROUND

During the process of developing a circuit design, the behavior of the design is simulated based on a specification of the circuit design. Simulating the design helps to verify correct behavior prior to physical implementation of the circuit. Wasted manufacturing costs due to faulty design may thereby be avoided.

Numerous tools are available for simulating circuit designs including, for example, high-level modeling systems (HLMSs) and HDL simulators. Co-simulation may also be used when the design may be more efficiently simulated by simulating different parts of the design on different simulation platforms ("co-simulation platforms").

Example co-simulation platforms include both software-based and hardware-based systems. In a software-based system, a portion of the design is emulated with software running on a workstation, for example. In a hardware-based system, a portion of the design is emulated on a hardware platform that includes a programmable logic device (PLD) such as a field programmable gate array (FPGA). Co-simulating on a hardware platform may be used to reduce the time required for a simulation run. The Modelsim simulator and the NC-SIM simulator from Cadence are example software-based systems, and the Wildcard development platform from Annapolis Microsystems and the Benone development platform from Nallatech are example hardware-based systems. The WildCard and Benone platforms are often used for algorithm exploration and design prototyping.

Most design tools recognize and support a hierarchical specification of the design, which allows the design to be specified and viewed at different levels of abstraction. The term "block" is sometimes used to refer to a collection of parts of a design that perform a function. Blocks produce outputs as a function of the inputs and internal state, blocks are connected by arcs, and arcs conduct data between blocks. At some level in this hierarchical framework, simulating the design involves moving data from one block of the design to another block of the design.

In some designs both scalar and vector data may be transferred between various blocks. A scalar may be viewed as a single data value, and a vector may be viewed as a set of multiple data values. For example, a vector may be a set of multiple, consecutively addressable scalars, such as an array. In specific applications, a vector may be a two-dimensional array implementing a matrix or frame of data.

Design and simulation issues may arise when one block processes vectors, another block processes scalars, and one of the blocks supplies or uses data from the other block. To provide a vector output from a vector-function block as input to scalar-function block, the vector is serialized into scalars and may be time-multiplexed for input to the scalar-function block. Forcing a designer to deal with implementation-level decisions early in the design stage may be counterproductive.

The present invention may address one or more of the above issues.

SUMMARY OF THE INVENTION

Various embodiments of the invention present methods for processing a circuit design. A first block, a second block, a shared memory, and a third block are generated in the circuit design in response to user input control. The first block is coupled to the second block, the second block is coupled to the shared memory, and the shared memory is coupled to the third block in response to user input control. During one cycle of a simulation, the second block, in response to the first block, accesses a set of scalar values in the shared memory using scalar accesses (for example, read(s) or write(s)). During one cycle of the simulation, the set of scalar values is transferred between the second block and the first block (which includes in one embodiment, either the second block to the first block or the first block to the second block). During the simulation, the shared memory is accessed by the third block using scalar accesses.

Another embodiment of the invention presents a co-simulation system including a hardware-based co-simulation platform and a software-based co-simulation platform. The hardware-based co-simulation platform simulates a shared memory and a first block. The simulation of the first block accesses multiple scalar values of non-scalar data in the shared memory. The software-based co-simulation platform simulates a second block and a third block. The simulation of the third block transfers the non-scalar data between the second block and the shared memory in the hardware-based co-simulation platform in a single simulation cycle.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
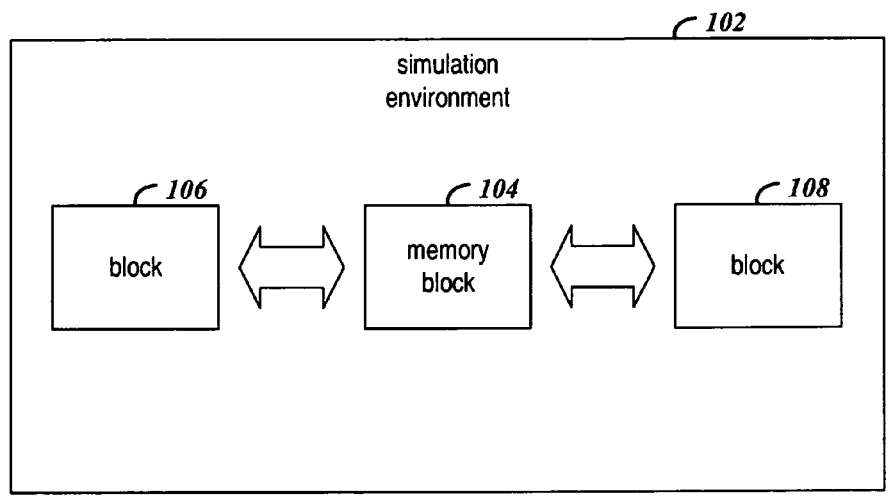
FIG. 1 is a functional block diagram of a simulation environment in which a memory block of a circuit design is shared by two other blocks of the design, in accordance with various embodiments of the invention.
Figure 2:
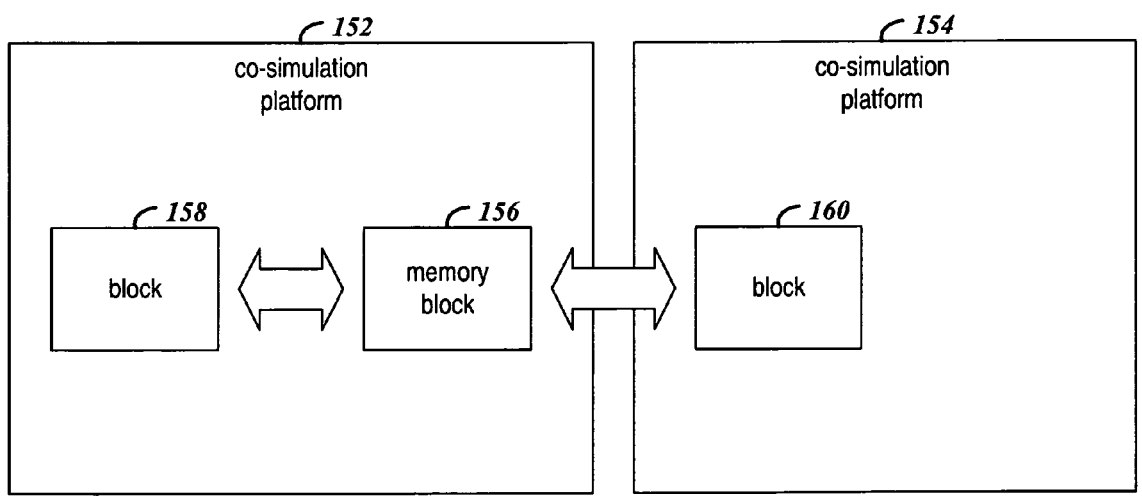
FIG. 2 is a functional block diagram of a simulation environment in which two co-simulation platforms are used to simulate a circuit design that includes a memory block shared by multiple blocks, in accordance with various embodiments of the invention.

FIGS. 1 and 2 illustrate at a functional level different simulation environments in which the present invention may be used. FIG. 1 is a functional block diagram of a simulation environment 102 in which a memory block 104 of a circuit design is shared by two other blocks 106 and 108 of the design. For ease of illustration a simple design is illustrated with blocks 106 and 108 sharing memory block 104. It will be appreciated, however, that the invention may be applied to designs of greater complexity, and a memory block may be shared by more than two blocks of a design.

Each of blocks 106 and 108 represents a function within a circuit design, and the memory block 104 is shared between the blocks. That is, both blocks may have read and/or write access to the memory block. Depending on design requirements, the memory block may be a RAM, a FIFO (queue or pipe), LIFO (stack), addressable shift register, register, memory mapped register (i.e., a register identified with an address in a RAM), or a processor's register bank or instruction store, for example.

In one embodiment, memory block 104 may be provided as a feature utilized only for simulation of the design. That is, multiple functional blocks may access the shared memory block during simulation even though some of the functional blocks may not be directly linked one to another in the design. For example, one or more functional blocks may be simulated in a process external to the simulation environment 102, while sharing access to memory block 104 with functional blocks 106 and 108 inside the simulation environment 102. The functional blocks may all have vector-based access to the shared memory, and the shared memory may be accessible to blocks simulated on various platforms.

The simulation environment 102 illustrates one use of the invention in a single simulator, e.g., an HLMS or HDL simulator. In the simulation environment, the blocks 106 and 108 may be simulated using multiple threads or multiple processes, and the memory block 104 simulated using shared memory in the computing arrangement that hosts the simulation environment ("host"). Synchronization mechanisms, such as mutually exclusive access implemented via locking are available in simulating the memory block.

A user of an HLMS may create the circuit design by graphically selecting blocks 104, 106, and 108 from libraries of functional blocks. A user of an HLMS also usually creates the connections between blocks and in one embodiment the connections between the memory block 104 and blocks 106 and 108 are arcs that are created by the user. However, a memory block, such as memory block 104, may be implicitly connected to other blocks through symbolic association in another embodiment. In the embodiment with symbolically associated memory blocks, these connections may be automatically created by the HLMS in response to specification of blocks 106 and 108. Depending on implementation requirements, a graphical interface presented to a user of the HLMS that corresponds to simulation environment 102 may or may not show explicit connections between blocks 104, 106, and 108.

FIG. 2 is a functional block diagram of a simulation environment in which two co-simulation platforms 152, 154 are used to simulate a circuit design that includes a memory block 156 shared by blocks 158 and 160. Block 158 is simulated on co-simulation platform 152, and block 160 is simulated on co-simulation platform 154.

The memory block 156 is hosted by co-simulation platform 152. Thus, co-simulation platform 152 also hosts additional shared memory circuitry used to simulate the memory block 156, along with the programming interface to that shared memory. For further details regarding shared memory, see FIG. 8 through FIG. 12 and the related discussion. Co-simulation platform 152 may include a host computing arrangement executing an HLMS or an HDL simulator, and co-simulation platform 154 may be a hardware-based co-simulation platform or another HLMS or HDL simulator hosted on the same or another computing arrangement.

When the co-simulation platform 154 is a hardware-based co-simulation platform, co-simulation platform 152 includes a board interface layer (not shown) for interfacing with co-simulation platform 154. The board interface layer includes a programming interface that is accessible to the co-simulation platform 152 for opening and closing the co-simulation platform 154 and exchanging data between the co-simulation platforms 152 and 154. In addition, for the co-simulation platform 154 to interface with the shared memory that simulates memory block 156, the board interface layer may be adapted to call the programming interface that implements the shared memory.

Figure 3A:
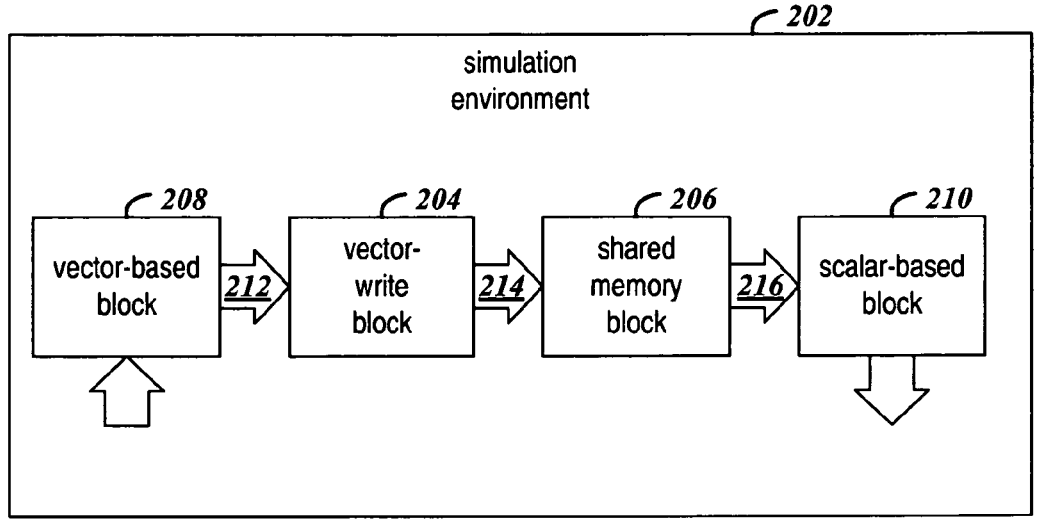
FIG. 3A illustrates a simulation environment in which a vector-write block is used to support writing of vectors to a shared memory block by a vector-based functional block, in accordance with various embodiments of the invention.

FIG. 3A illustrates a simulation environment 202 in which a vector-write block 204 is used to support writing of vectors to a shared memory block 206 by a vector-based functional block 208. The vector-based block 208 may be a producer and the scalar-based block 210 may be a consumer of data sent from block 208 to block 210 via vector-write block 204 and shared memory block 206.

The vector-based block 208 outputs non-scalar data to the vector-write block 204. Types of non-scalar data include vectors of scalar values, matrices of scalar values, and frames of scalar values. The scalar values in non-scalar data also have a type and example types for scalar values include integers, fixed point numbers, and floating point numbers, each of various precisions. A two-dimensional matrix may be visualized as an array having rows and columns of scalar values, and each row and each column of a matrix may be represented as a row vector or a column vector, respectively. In general, a matrix may have more than two dimensions. A frame is similar to a two-dimensional matrix with each row of the frame representing a vector of scalar values for a "slice" of simulation time.

The vector-based block 208 may provide type information describing the non-scalar data output by vector-based block 208 to the vector-write block 204 along with the non-scalar data. The vector-write block 204 may determine the format of the data received from the vector-based block 208 using the type information provided by the vector-based block 208, and the vector-write block 204 may be adaptable to support any type of scalar or non-scalar data using the provided type information. Based on the format of the non-scalar data received from the vector-based block 208, the vector-write block 204 writes the non-scalar data to the shared memory 206. Generally, writing the non-scalar data to the shared memory block 206 involves serially writing the scalar values of the non-scalar data in a particular order to sequential locations in the shared memory block 206.

Typically, each item of non-scalar data is transferred from the vector-based block 208 to the vector-write block 204 as a unit in a single simulation cycle. For non-scalar data that is a vector or a matrix, the non-scalar data is also typically written as a unit to the shared memory block 206 in a single simulation cycle. The single-cycle transfer of non-scalar data between blocks in an HLMS allows the user of an HLMS to concentrate on designing the data flow for a circuit design while ignoring the details of data formatting. In addition, the vector-write block 204 may need to write the entire non-scalar data in a single simulation cycle because the vector-based block 208 may send another item of non-scalar data to the vector-write block 204 in the next simulation cycle.

For a frame, the row vectors of the frame may be sequentially written by vector-write block 204 to shared memory block 206 over several simulation cycles, with one or more row vectors of the frame written to the shared memory block in each of these simulation cycles. The number of row vectors of the frame that are transferred in a simulation cycle may automatically match the size of the shared memory, allowing the size of a frame to exceed the size of the shared memory. Alternatively, the number of row vectors that are transferred in a simulation cycle may automatically fill the space currently available in the shared memory, allowing the rate of filling shared memory block 206 by vector-write block 204 to match the rate of consumption by scalar-based block 210. The scalars of the number of row vectors that are transferred in a simulation cycle are a set of scalar values written by vector-write block 204 to shared memory block 206.

A producer and a consumer may produce and consume non-scalar data using different types. For example, in a simulation cycle scalar-based block 210 may consume one scalar value from the non-scalar data. Thus, usage of shared memory block 206 allows a user of an HLMS to ignore certain details of conversion between data formats.

A user of an HLMS may create a circuit design according to FIG. 3A at a user interface for the HLMS by graphically selecting the vector-based block 208, the vector-write block 204, the shared memory block 206 and the scalar-based block 210 from component libraries presented graphically. A user of an HLMS may explicitly create the data flow connection 212 between blocks 208 and 204 by graphically creating a connection between an output port of block 208 and an input port of block 204.

A name may be assigned to the shared memory block 206 by providing a name string as a parameter to the instance of the shared memory block 206. The user of an HLMS may also implicitly create the connection 214 by providing this name string as a parameter of the vector-write block 204 that specifies the name of the shared memory to be accessed by the vector-write block 204. Similarly, the connection 216 may be implicitly created by providing the name string as a parameter of the scalar-based block 210.

Figure 3B:
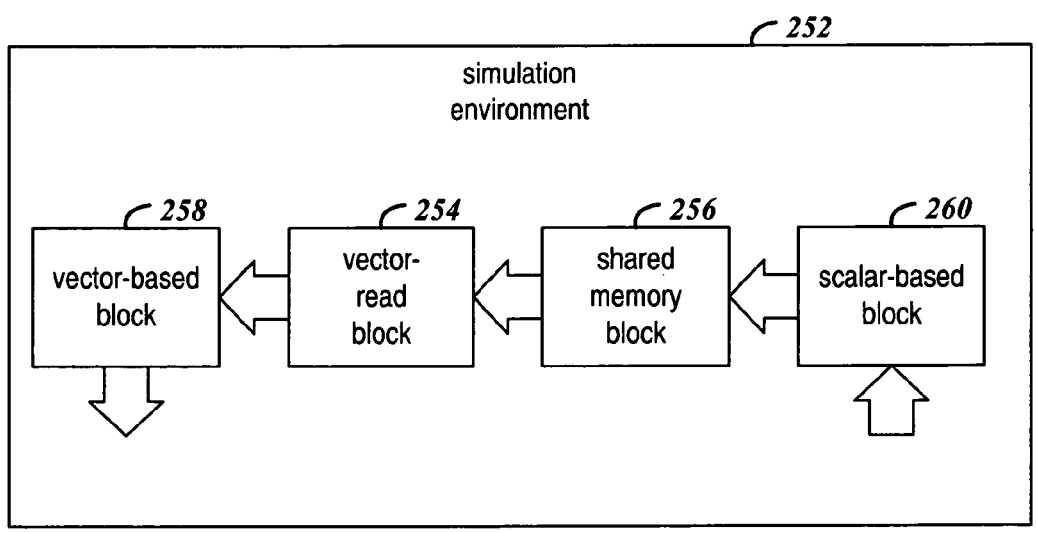
FIG. 3B illustrates a simulation environment in which a vector-read block is used to support reading of vectors from a shared memory block by a vector-based functional block, in accordance with various embodiments of the invention.

FIG. 3B illustrates a simulation environment 252 in which a vector-read block 254 is used to support reading of vectors from a shared memory block 256 by a vector-based functional block 258. Scalar-based block 260 may be a producer that produces a scalar value each simulation cycle and vector-based block 258 may be a consumer that consumes non-scalar data, including multiple scalar values from the vector-based block 258, in a single simulation cycle. The scalar values produced by scalar-based block 260 are sent to the vector-based block 258 reformatted as non-scalar data via the shared memory block 256 and the vector-read block 254.

The shared memory block 256 may be given a name by providing a name string as a parameter of the shared memory block 256. The vector-read block 254, the shared memory block 256, and the scalar-based block 260 may be implicitly connected by using this name string as a parameter of each of these blocks.

Typically, the vector-read block 254 has additional parameters that specify the type of non-scalar data that is output because the implicit connection from the shared memory block 256 does not provide the type of the non-scalar data and the vector-read block 254 may be adaptable to support any type of scalar or non-scalar data using the additional parameters. The additional parameters may specify the dimensions and type of scalar values in the non-scalar data. Example dimensions include an 8-value vector or a 3-by-3 matrix, and example types include signed or unsigned integers with 8-bits, 16-bits, or 32-bits or floating point numbers with various precisions.

Because the vector-read block 254 reads non-scalar data containing multiple scalar values in a simulation cycle while the scalar-based block 260 writes only a single scalar value in a simulation cycle, data could be read from the shared memory block 256 at a higher rate than data is written into the shared memory block 256. Thus, a flow control mechanism is used to prevent underflow of the shared memory block 256. A parameter of the vector-read block 254 may be used to prevent underflow by providing the number of simulation cycles between reads of non-scalar data from the shared memory block 256 by the vector-read block 254. It will be appreciated that a flow control mechanism may also be used to prevent overflow of the shared memory block 256 and that alternative methods may be used to prevent or detect underflow and overflow.

Because the vector-based block 258 receives an item of non-scalar data from the vector-read block 254 in a single simulation cycle, the vector-based block 258 may immediately process any portion of the non-scalar data. Thus, the details of tracking the transfer of scalar values in non-scalar data may be ignored by a user of an HLMS.

It will be appreciated that the scalar-based block 210 of FIG. 3A may be a vector-read block with parameters that configure block 210 to read scalar values from shared memory block 206, and the scalar-based block 260 of FIG.

3B may be a vector-write block that receives and writes scalar values to shared memory block 256.

Figure 4:
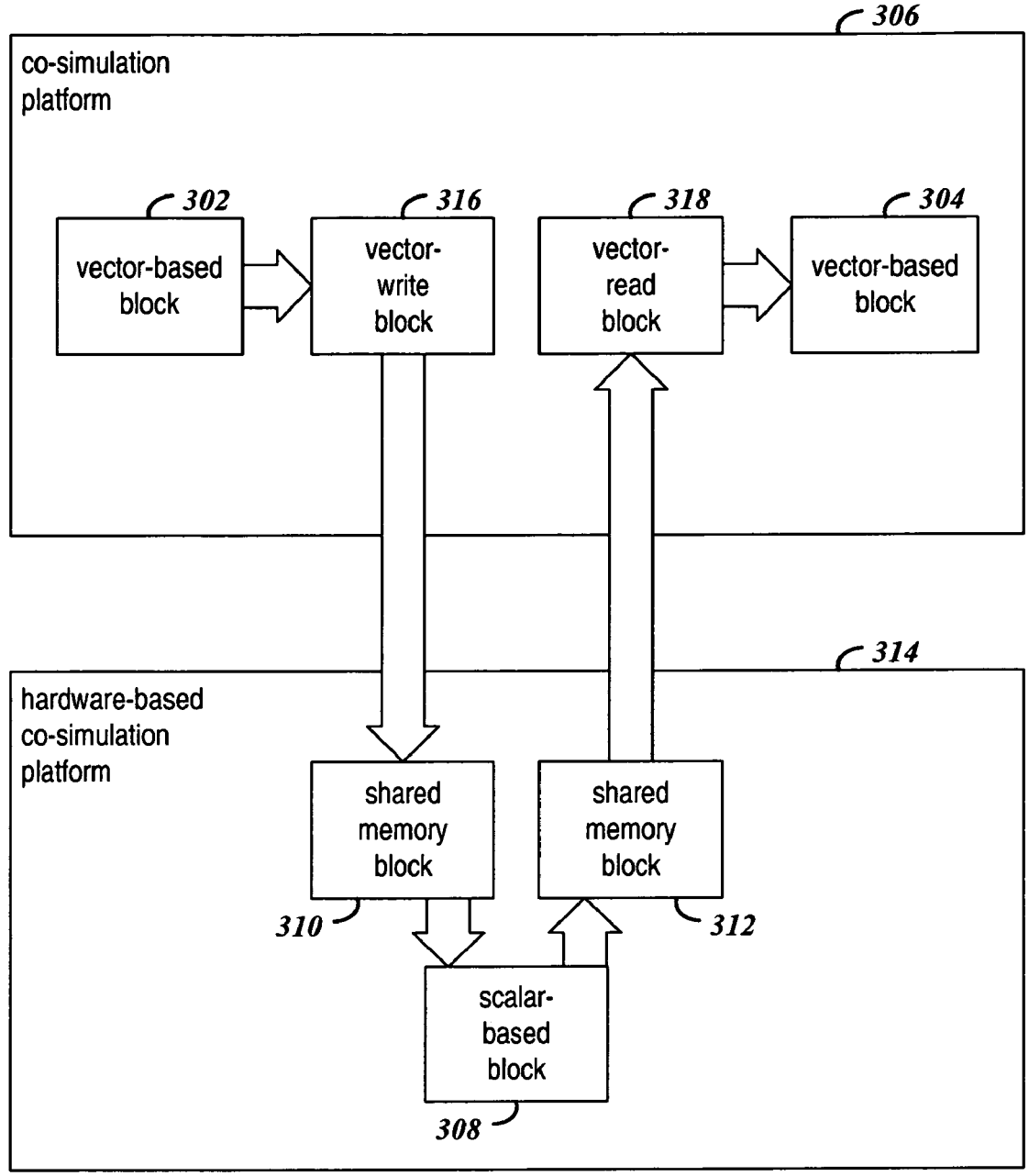
FIG. 4 illustrates a co-simulation arrangement in which vector-based functional blocks are simulated on one co-simulation platform and a scalar-based functional block, along with shared memories, are simulated on a hardware-based co-simulation platform, in accordance with various embodiments of the invention.

FIG. 4 illustrates a co-simulation arrangement in which vector-based functional blocks 302 and 304 are simulated on one software-based co-simulation platform 306 and a scalar-based functional block 308, along with shared memories 310 and 312, are simulated on a hardware-based co-simulation platform 314. The vector-based block 302, the scalar-based block 308, and the vector-based block 304 may form a data processing pipeline, such as an image processing pipeline for streaming video. For example, scalar-based block 308 may be a computationally intensive 2-D filter data-path implemented in a PLD of hardware-based co-simulation platform 314, vector-based block 302 may source a video data stream from a real-time camera attached to the host workstation, and vector-based block 304 may display the filtered video data stream.

The vector-based block 302 generates non-scalar data and the vector-write block 316 writes the non-scalar data to shared memory block 310 in the hardware-based co-simulation platform 314. The vector-write block 316 may use a burst data transfer to transfer each item of non-scalar data from the co-simulation platform 306 to the hardware-based co-simulation platform 314. Example burst data transfers include a DMA transfer and a single transaction containing the non-scalar data, including each scalar value in the non-scalar data.

The scalar-based block 308 reads scalar data from the shared memory block 310 and writes scalar data to the shared memory block 312. The scalar-based block 308 may read scalars from shared memory block 310 and write scalars to shared memory block 312 using a local clock of the hardware-based co-simulation platform 314. The rate of the local clock may exceed the rate for simulation cycles of the co-simulation platform 306, such that the scalar-based block 308 may exchange many scalars with shared memory blocks 310 and 312 in a single simulation cycle of the co-simulation platform 306. For example, the scalar-based block 308 may be able to read an entire item of non-scalar data from shared memory block 310 and similarly write an entire item of non-scalar data to shared memory block 312 in a single simulation cycle of the co-simulation platform 306, such that each of blocks 302, 308, and 304 may process a respective item of non-scalar data every simulation cycle of co-simulation platform 306. Interpreting non-scalar data as a sequence of scalars may be useful in scenarios where some blocks, such as block 308, may operate at a faster rate than the simulation cycle rate.

The vector-read block 318 reads non-scalar data from the shared memory block 312 and sends the non-scalar data to vector-based block 304. The vector-read block 318 may use a burst data transfer to transfer each item of non-scalar data from the hardware-based co-simulation platform 314 to the co-simulation platform 306.

Figure 5:
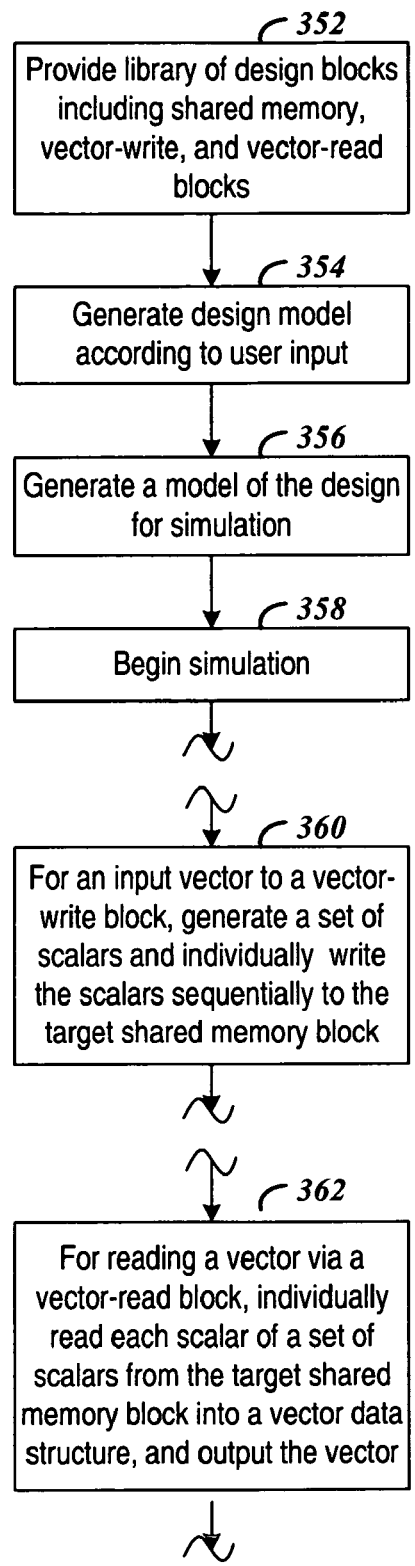
FIG. 5 is a flow diagram of an example process for preparing a circuit design in accordance with various embodiments of the invention.

FIG. 5 is a flow diagram of an example process for preparing a circuit design in accordance with various embodiments of the invention. At step 352, a library is provided including a shared memory block, a vector-write block, a vector-read block. The library may include a vector-write-read block for providing both write and read access to a shared memory. A vector-write-read block is an example of both a vector-write block and a vector-read block.

At step 354, a design model is generated according to user input. The user may select blocks from libraries including the library provided in step 352. The blocks in the libraries may be presented as graphical icons, and a user may select blocks from the libraries via a "drag-and-drop" operation. Connections between the selected blocks may be made by graphically connecting icons for the blocks by drawing a connecting arc between the icons. In addition, a shared memory connection may be made implicitly between two blocks by supplying respective parameters of the blocks with the same value, such as a name for the shared memory.

At step 356 a model is generated for a simulation. Generating a model may include selecting certain blocks of the design model for simulation on a co-simulation platform, including a hardware-based co-simulation platform. At step 358 the simulation of the design model is started.

During a simulation step of the simulation, an item of non-scalar data is written to a shared memory block by a vector-write block at step 360. The vector-write block receives the item of non-scalar data at an input of the vector-write block. The vector-write block serially writes the individual scalar values of the non-scalar data into sequential locations in the shared memory block. During a simulation step of the simulation, an item of non-scalar data is read from a shared memory block by a vector-read block at step 362. The vector-read block serially reads the individual scalar values of the non-scalar data from sequential locations in the shared memory block and sends the non-scalar data to an output of the vector-read block.

Figure 6A:
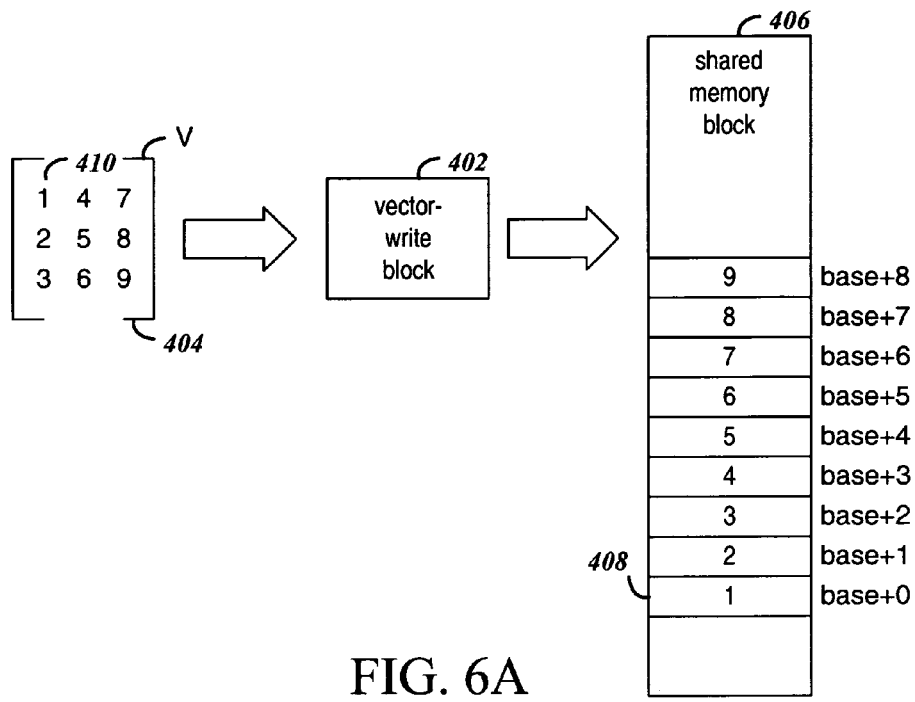
FIG. 6A illustrates operation of a vector-write block on an example vector during simulation, in accordance with various embodiments of the invention.

FIG. 6A illustrates operation of a vector-write block 402 on an example vector, V 404, during simulation. The vector V 404 is non-scalar data received at an input of the vector-write block 402 and is written to shared memory block 406 by the vector-write block 402.

The example vector, V 404, is a 3-by-3 matrix of nine scalar values as shown. The vector-write block 402 serially writes the nine scalar values of the vector V 404 to sequential locations in the shared memory block 406 beginning at a base location 408 of base+0. The nine scalar values are taken from vector V 404 and written to the shared memory block 406 in the cardinal number order 1-9 shown.

Figure 6B:
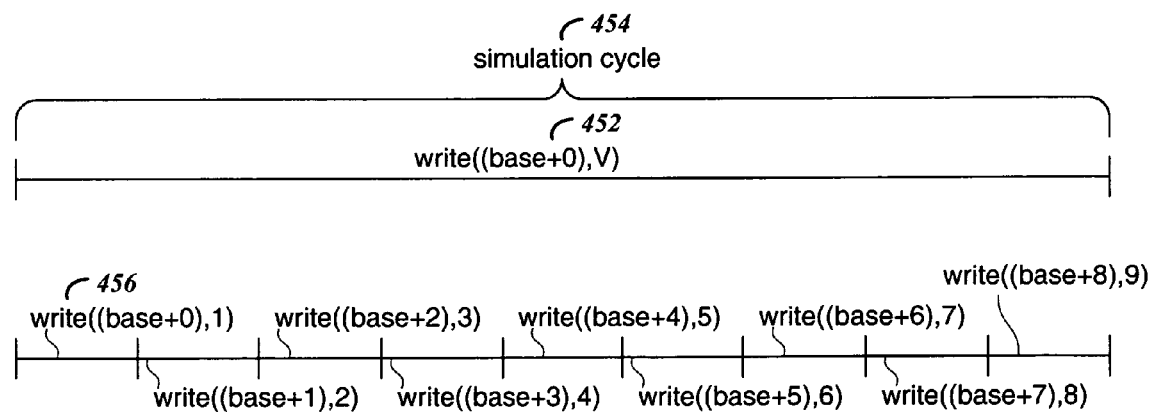
FIG. 6B illustrates the decomposition of the vector write request into multiple scalar write requests within a single simulation cycle for the example vector of FIG. 6A, in accordance with various embodiments of the invention.

FIG. 6B illustrates the decomposition of the vector write request 452 into multiple scalar write requests within a single simulation cycle 454 for the example vector, V 404, of FIG. 6A. The scalar value 410 in the first row and first column of vector V 404 is written by write request 456 to location 408 in shared memory block 406. The remaining eight of the nine scalar values in vector V 404 are sequentially written to successive locations in shared memory block 406 by similar write requests. The writing of the non-scalar data of vector V 404 is encapsulated by vector-write block 402 in a manner that is not visible to a simulation user.

Figure 7A:
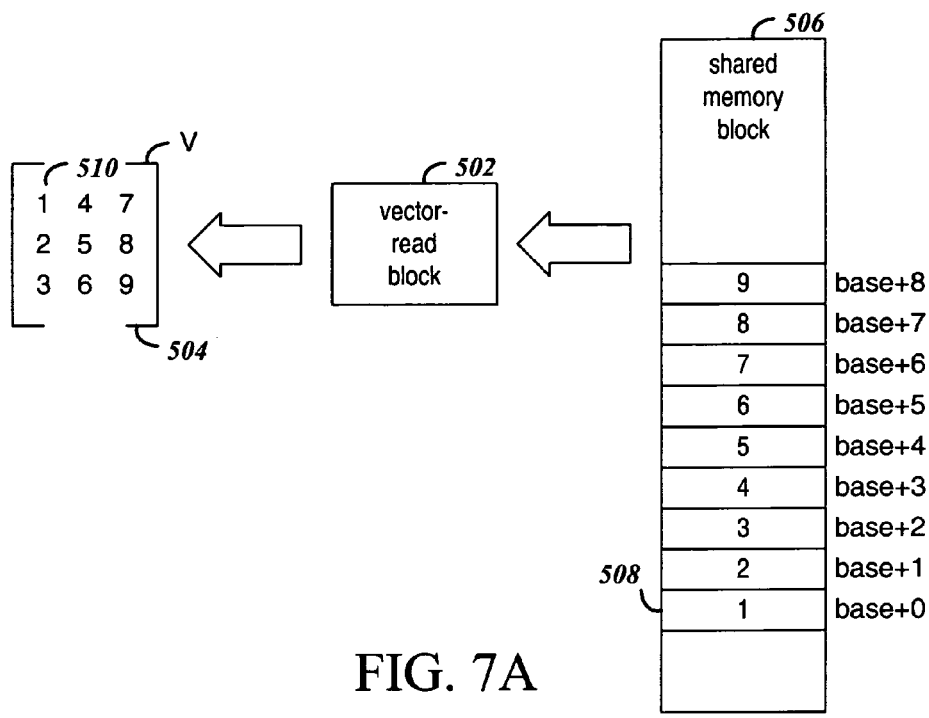
FIG. 7A illustrates operation of a vector-read block for reading a vector from a shared memory block during simulation, in accordance with various embodiments of the invention.

FIG. 7A illustrates operation of a vector-read block 502 for reading a vector, V 504, from a shared memory block 506 during simulation. The vector V 504 is non-scalar data supplied to at an output of the vector-read block 502.

The example vector, V 504, is a 3-by-3 matrix of nine scalar values as shown. The vector-read block 502 serially reads the nine scalar values for the vector V 504 from sequential locations in the shared memory block 506 beginning at a base location 508 of base+0. The nine scalar values are supplied to vector V 504 in the cardinal number order 1-9 shown.

Figure 7B:
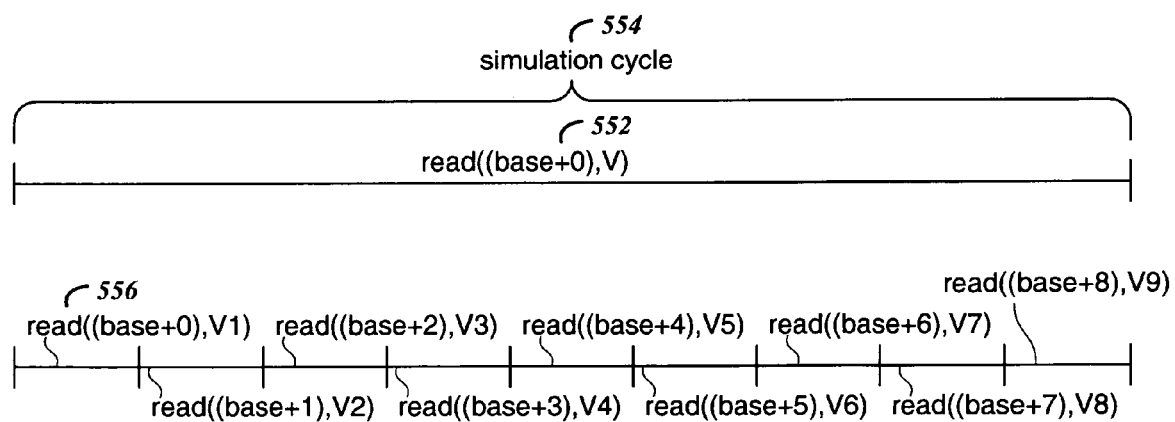
FIG. 7B illustrates the decomposition of the vector read request into multiple scalar read requests within a single simulation cycle for the example vector of FIG. 7A, in accordance with various embodiments of the invention.

FIG. 7B illustrates the decomposition of the vector read request 552 into multiple scalar read requests within a single simulation cycle 554 for the example vector, V 504, of FIG. 7A. The scalar value 508 is read by read request 556 from location base+0 in shared memory block 506 and supplied to scalar value 510 in the first row and first column of vector V 504. The remaining eight of the nine scalar values are sequentially read from successive locations in shared memory block 506 by similar read requests. The reading of the non-scalar data for vector V 504 is encapsulated by vector-read block 502 in a manner that is not visible to a simulation user.

Figure 8:
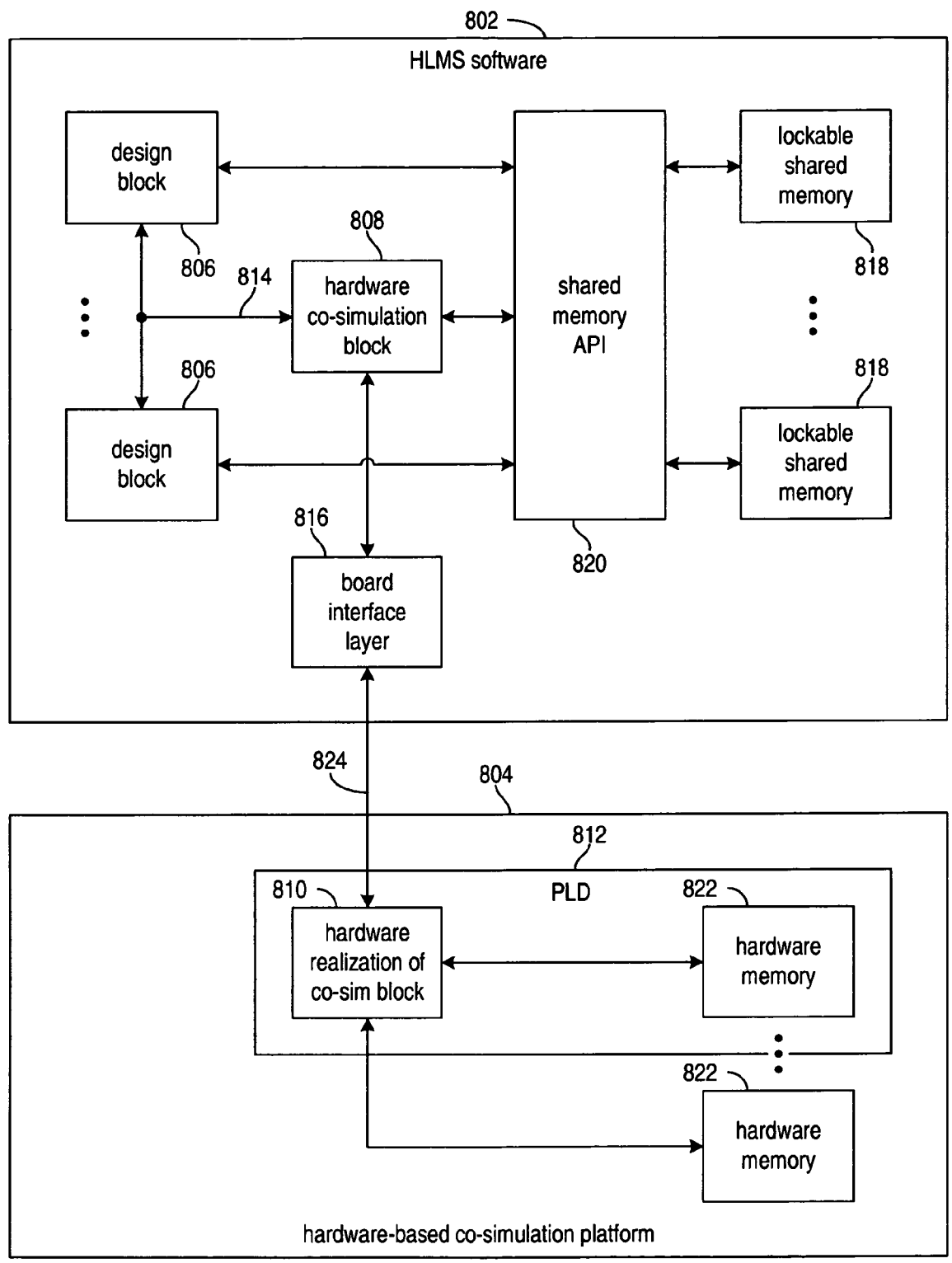
FIG. 8 is a block diagram of a simulation arrangement including an HLMS and a hardware-based co-simulation platform, according to various embodiments of the invention.

FIG. 8 is a block diagram of a simulation arrangement including an HLMS 802 and a hardware-based co-simulation platform 804, according to various embodiments of the invention. The HLMS 802 and the hardware-based co-simulation platform 804 cooperate to perform a simulation of a circuit design.

The circuit design includes design blocks 806 and a co-simulation block having a proxy, hardware co-simulation block 808, in the HLMS 802 and having hardware realization 810 in PLD 812 on the hardware based co-simulation platform 804. The HLMS 802 simulates design blocks 806 in software on a general purpose computer or a collection of networked computers and the co-simulation block is simulated in hardware by realization 810 on the hardware based co-simulation platform 804.

Inputs and outputs for the blocks of the circuit design may be communicated during simulation by signals represented by lines 814. The hardware co-simulation block 808 acts as a proxy in HLMS 802 for the hardware realization 810 of the co-simulation block. The inputs on lines 814 for the co-simulation block are received by the hardware co-simulation block 808 and sent to the hardware realization 810 of the co-simulation block via board interface layer 816. The outputs of the hardware realization 810 of the co-simulation block are sent via board interface layer 816 to the hardware co-simulation block 808, which transmits the outputs on lines 814.

In addition to communication using signals on lines 814, the design blocks 806 and the hardware co-simulation block 808 may communicate during simulation using shared memory blocks, such as lockable shared memory blocks 818. Shared memory blocks, such as 818, can be accessed by design blocks 806 and hardware co-simulation block 808 via the application programming interface (API) 820 for shared memory. Shared memory blocks 818 may be locked for exclusive access by one of the design blocks 806 or the hardware co-simulation block 808.

For further information on the shared memory API, refer to the co-pending patent/application titled, "Shared Memory Interface for Use in Electronic Design Simulation," by Milne et al., filed on Sep. 24, 2004 and having U.S. patent application Ser. No. 10/949,049, and assigned to the assignee of the present invention, the contents of which are incorporated herein by reference.

Each lockable shared memory block 818 may have a corresponding hardware memory 822 in the hardware based co-simulation platform 804. The data for a lockable shared memory 818 may be duplicated in the corresponding hardware memory 822, allowing the hardware realization 810 of the co-simulation block to access the same data from a hardware memory 822 that a design block 806 can access from the corresponding lockable shared memory block 818. Thus, a lockable shared memory block 818 provides a local copy for the HLMS 802 of data in a memory block of the circuit design and a hardware memory 822 provides a local copy for the hardware-based co-simulation platform 804 of the data in the memory block.

Because there are two copies 818 and 822 of the data for a memory block, data synchronization is required to maintain data coherency. To maintain data coherency, the data from a lockable shared memory block 818 may be transferred to the corresponding hardware memory 822 before the hardware realization 810 of the co-simulation block begins accessing the hardware memory 822, and subsequently the data from the hardware memory 822 may be transferred back to the lockable shared memory block 818 after the hardware realization 810 of the co-simulation block completes accessing the hardware memory 822. The data transfer in each direction may be a burst data transfer to efficiently utilize the communication link 824, such as PCI or USB, between the HLMS computer 802 and the hardware based co-simulation platform 804.

It will be appreciated that certain memory blocks of the circuit design may be accessed only from design blocks 806, and thus do not need to be duplicated in hardware memories 822. In addition, a hardware memory 822 may be comprised of memory resources within PLD 812, an external memory device, or various combinations thereof.

Figure 9:
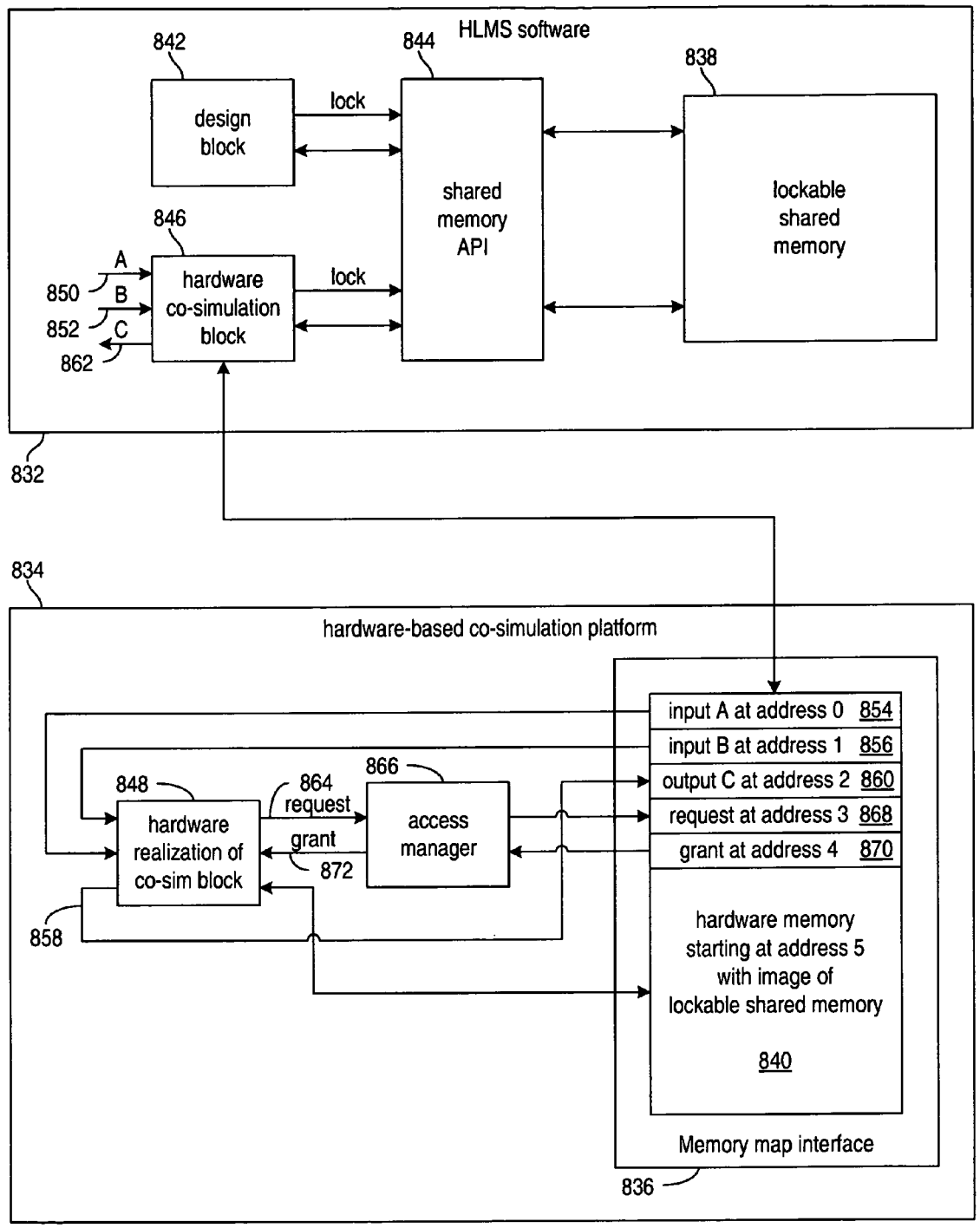
FIG. 9 is a block diagram of a simulation arrangement in which an HLMS and a hardware based co-simulation platform use a memory map interface to manage a memory block, according to various embodiments of the invention.

FIG. 9 is a block diagram of a simulation arrangement in which an HLMS 832 and a hardware based co-simulation platform 834 use a memory map interface 836 to manage a memory block, according to various embodiments of the invention. The data in the memory block is duplicated in the lockable shared memory block 838 and the hardware memory 840 in the memory map interface 836, for example, starting at address five.

During simulation, design block 842 accesses the lockable shared memory block 838 via the shared memory API 844 and the design block 842 should lock the lockable shared memory block 838 before access. The lock enforces mutually exclusive access to the lockable shared memory block 838, for example, the design block 842 may not obtain the lock from the shared memory API 844 if the lockable shared memory block 838 is already locked by the hardware co-simulation block 846. Conversely, the hardware co-simulation block 846 may not obtain the lock from the shared memory API 844 if the lockable shared memory block 838 is already locked by the design block 842. If the lockable shared memory block 838 is already locked, a block 842 or 846 requesting the lock may not obtain the lock until the lock is released. Typically, a block 842 or 846 releases the lock when the block has completed accessing the lockable shared memory 838.

Hardware co-simulation block 846 acts as a proxy in the HLMS 832 for the hardware realization 848 of the co-simulation block. During simulation, the hardware co-simulation block 846 receives inputs, for example inputs A and B on lines 850 and 852 respectively, from simulation blocks, such as design block 842. The hardware co-simulation block 846 forwards the values of the inputs on lines 850 and 852 to locations zero (854) and one (856) of the memory map interface 836, and locations zero and one are connected to the hardware realization 848 of the co-simulation block as corresponding inputs. During simulation, the hardware realization 848 of the co-simulation block may generate output values, for example the output on line 858 sent to location two 860 in memory map interface 836. The hardware co-simulation block 846 may read location two 860 of the memory map interface 836 and forward the value to the output C on line 862.

To access the data in the memory block, the hardware realization 848 of the co-simulation block sends a request on line 864 via access manager 866 to location three (868) in the memory map interface 836. In response to reading the request from location three 868 in the memory map interface 836, the hardware co-simulation block 846 locks the lockable shared memory block 838. The locking of the lockable shared memory block 838 by the hardware co-simulation block 846 may be delayed if the lockable shared memory 838 is already locked. After acquiring the lock to the lockable shared memory block 838, the hardware co-simulation block 846 reads the data from the lockable shared memory block 838, and forwards the data to the hardware memory 840 in the memory map interface 836. The data read and/or forwarded may be limited to a subset of the data in the lockable shared memory block 838 that includes modified data, as is later discussed in detail. After the data forwarding is complete, the hardware co-simulation block 846 sends a grant to location four 870 of memory map interface 836. The hardware realization 848 of the co-simulation block receives the grant on line 872 via the access manager 866.

On receiving the grant on line 872, the hardware realization 848 of the co-simulation block may process the data in the hardware memory 840. After completing the processing of the data in the hardware memory 840, the hardware realization 848 of the co-simulation block sends a released request on line 864 via access manager 866 to location three 868 in the memory map interface 836. In response to reading the released request from location three 868 in the memory map interface 836, the hardware co-simulation block 846 reads the data from the hardware memory 840 in the memory map interface 836, and forwards the data to the lockable shared memory block 838. The data read and/or forwarded may be limited to a subset of the data in the lockable shared memory block 838 that includes modified data, as is later discussed in detail. After the data forwarding is complete, the hardware co-simulation block 846 unlocks the lockable shared memory 838 and sends a released grant to location four 870 of memory map interface 836. The hardware realization 848 of the co-simulation block receives a released grant on line 872 from the access manager 866, as is later discussed in detail in connection with FIG. 11.

Figure 10:
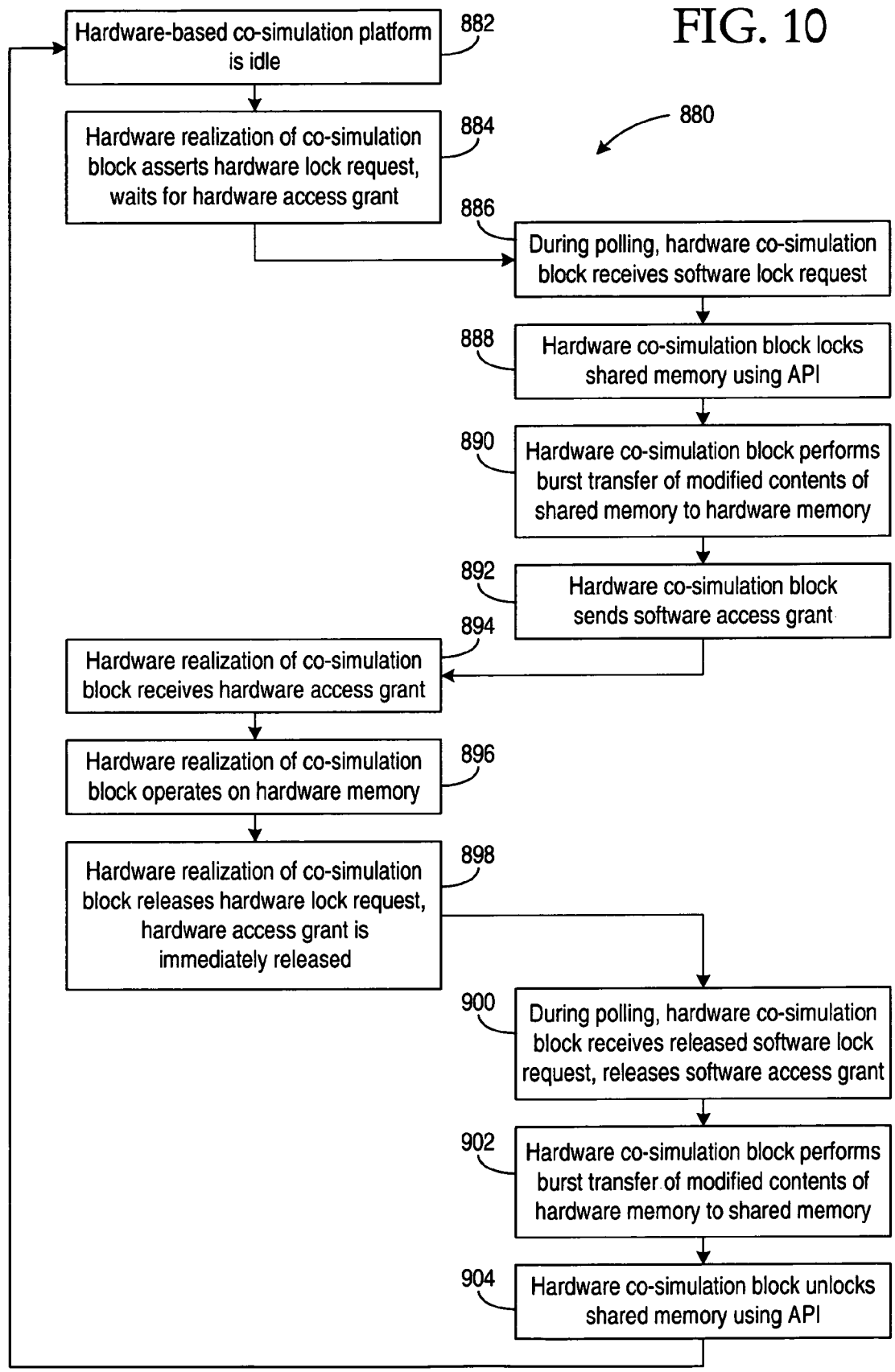
FIG. 10 is a flow diagram of an example parallel process for accessing shared memory during co-simulation, according to various embodiments of the invention.

FIG. 10 is a flow diagram of an example parallel process 880 for accessing shared memory during co-simulation, according to various embodiments of the invention. Steps 882, 884, 894, 896, and 898 are performed by a hardware based co-simulation platform and steps 886, 888, 890, 892, 900, 902, and 904 are performed by HLMS software on a general purpose computer. It will be appreciated that parallel process 880 may be readily extended to multiple shared memories.

At step 882, the hardware based co-simulation platform is idle. At step 884, the hardware realization of the co-simulation block requests access to the data in a memory block by asserting a hardware lock request. The hardware realization of the co-simulation block waits to receive a hardware access grant before accessing the data for the memory block in a hardware memory.

At step 886, the hardware co-simulation block in the HLMS actively polls for a software lock request. On receiving a software lock request resulting from the hardware lock request, the HLMS proceeds to step 888. At step 888, the hardware co-simulation block locks the shared memory using a shared memory API. The lock may not be obtained immediately if the shared memory is already locked. On obtaining the lock for the shared memory, the HLMS proceeds to step 890. It will be appreciated that the HLMS may be performing a portion of the simulation including accessing the shared memory in parallel with steps 886 and 888, and the HLMS may be performing a portion of the simulation that does not access the shared memory in parallel with steps 886, 888, 890, 892, 900, 902, and 904.

At step 890, the hardware co-simulation block performs data synchronization between the shared memory block and the hardware memory in the hardware based co-simulation platform. After data synchronization, the software memory and the hardware memory contain coherent data. Generally, the data synchronization transfers to the hardware memory at least the data modified by the HLMS in the shared memory since the previous data synchronization. Typically, the transfer uses a burst data transfer, such as transferring values for multiple memory locations in each of one or more transactions. At step 892, the hardware co-simulation block sends a software grant to the hardware based co-simulation platform.

At step 894, the hardware realization of the co-simulation block receives a hardware grant resulting from the software grant, enabling the hardware realization of the co-simulation block to process the data in the hardware memory at step 896. At step 898, the hardware realization of the co-simulation block releases the hardware lock request. Typically, the hardware access grant received by the hardware realization of the co-simulation block is immediately released.

At step 900, the hardware co-simulation block in the HLMS actively polls for a released software lock request. On receiving a released software lock request corresponding to the released hardware lock request, the HLMS proceeds to step 902. At step 902, the hardware co-simulation block performs data synchronization between the shared memory and the hardware memory. After data synchronization, the software memory and the hardware memory contain corresponding data values. Generally, the data synchronization transfers to the shared memory at least the data modified by the hardware realization of the co-simulation block in the hardware memory since the previous data synchronization. Typically, the transfer uses a burst data transfer. At step 904, the hardware co-simulation block unlocks the shared memory using the shared memory API.

Figure 11:
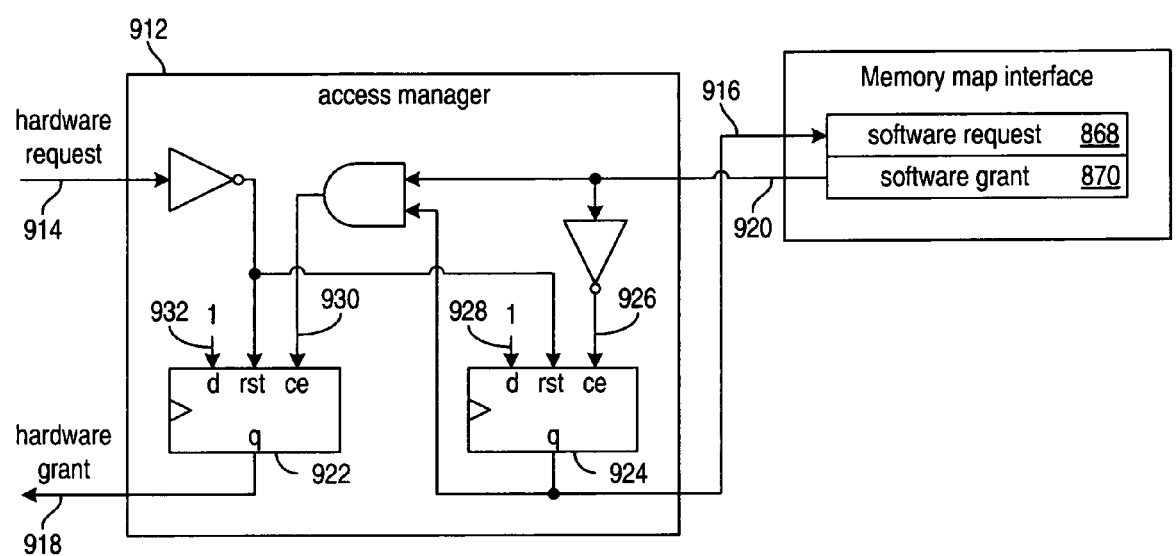
FIG. 11 is a block diagram of an access manager for managing access request and grant signals, according to various embodiments of the invention.

FIG. 11 is a block diagram of an access manager 912 for managing access request and grant signals on lines 914, 916, 918, and 920, according to various embodiments of the invention. The access manager 912 propagates the hardware access request on line 914 into a corresponding software access request on line 916, while generating a hardware grant on line 918 and synchronizing with the software grant on line 920. In one embodiment, a hardware realization of the co-simulation block requires that the hardware access grant on line 918 be released immediately after the releasing of the hardware access request on line 914, as provided by the access manager 912.

Initially, the inputs on lines 914 and 920 are released with a deasserted value. The released value for the hardware access request on line 914 causes registers 922 and 924 to be reset, releasing the hardware access grant on line 918 and the software access request on line 916. The assertion of a hardware access request on line 914 combined with the continuing released value for the software access grant on line 920 causes register 924 to no longer be reset and to be enabled by clock enable on line 926 to latch the asserted data input on line 928. Thus, software access request on line 916 is asserted the cycle after the assertion of the hardware access request on line 914.

Eventually, the HLMS responds to the asserted software access request on line 916 with a software access grant on line 920. The combination of the asserted software access request on line 916 and the asserted software access grant on line 920 causes register 922 to be enabled by clock enable on line 930 to latch the asserted data input on line 932. Thus, hardware access grant on line 918 is asserted the cycle after the assertion of the software access grant on line 920.

After completing an operation, the hardware realization of the co-simulation block deasserts the hardware access request on line 914, immediately causing registers 922 and 924 to be reset, releasing the hardware access grant on line 918 and the software access request on line 916. The HLMS may have a delay interval before responding by deasserting the software access grant on line 920, but until the HLMS deasserts software access grant on line 920, register 924 is prevented by clock enable on line 926 from asserting another software access request on line 916, which in turn causes the clock enable on line 930 to prevent register 922 from asserting another hardware access grant on line 918.

Figure 12:
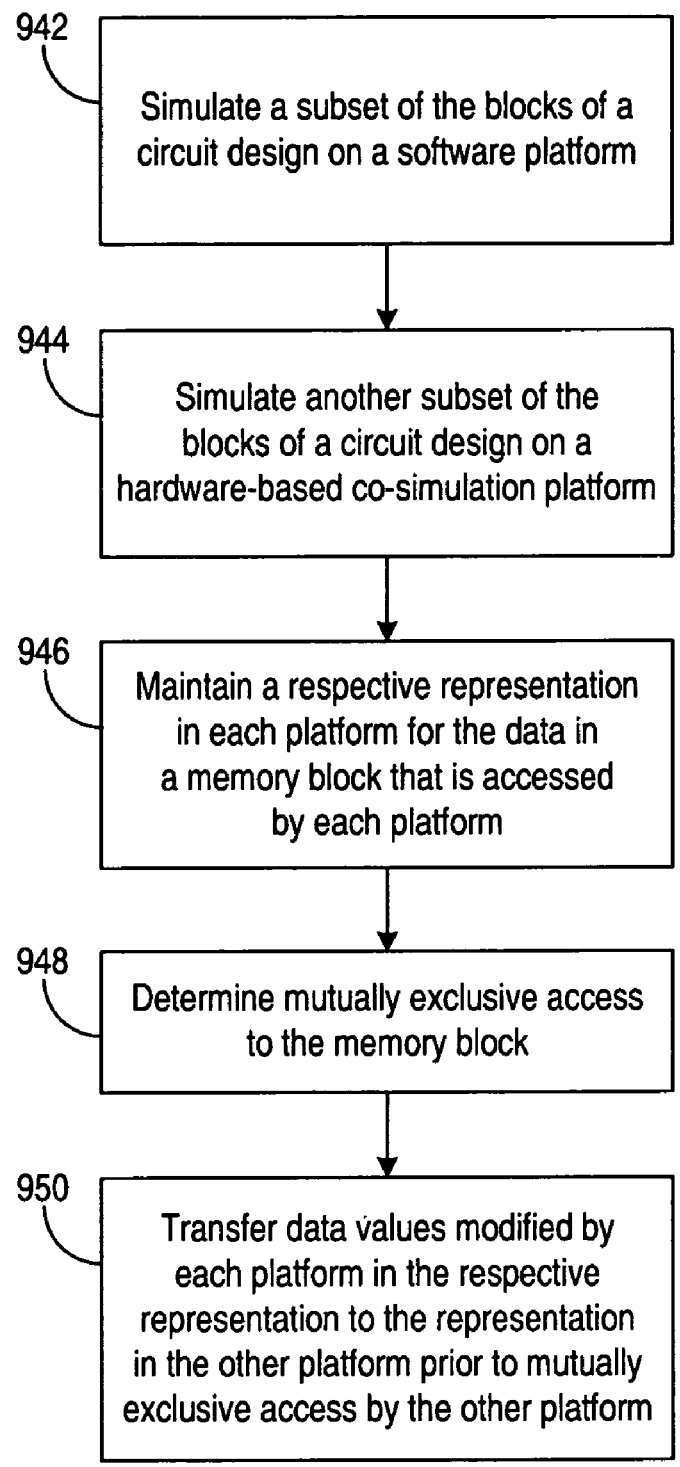
FIG. 12 is a flow diagram of a process for hardware co-simulation using shared memory, according to various embodiments of the invention.

FIG. 12 is a flow diagram of a process for hardware co-simulation using shared memory, according to various embodiments of the invention. Typically, one design block, which may be a block hierarchy, of a circuit design is selected to be simulated in hardware during hardware co-simulation, one or more shared memory blocks are simulated in a combination of hardware and software, and the remaining design blocks are simulated in software.

At step 942, a subset of the blocks of a circuit design is simulated on a software platform, typically in a HLMS on a general purpose computer. At step 944, another subset of the blocks of a circuit design is simulated in hardware on a hardware based co-simulation platform. At step 946, a hardware representation and a software representation are maintained for the data in a memory block. The hardware representation is maintained in hardware memory on the hardware based co-simulation platform and the software representation is maintained in memory on the software platform, such as lockable shared memory.

At step 948, mutually exclusive access to the data in the memory block is determined. Mutually exclusive access to the data may be provided by appropriate semaphore operations on the general purpose computer, such as may be provided by lockable shared memory. Mutually exclusive access to the data of a memory block may be split between the subset of the blocks simulated in software and the subset of the blocks simulated in hardware. In one embodiment, mutually exclusive access may be further split between the individual blocks of the subset of blocks simulated in software. While the blocks simulated in hardware are determined to have mutually exclusive access, the hardware based co-simulation platform may access the data for the memory block using the hardware representation. While a block simulated in software is determined to have mutually exclusive access, the software platform may access the data for the memory block using the software representation.

At step 950, prior to mutually exclusive access to the data for the memory block from the hardware based co-simulation platform, any of the data modified by the software platform is transferred from the software representation to the hardware representation. In addition, prior to mutually exclusive access to the data for the memory block from the software platform, and typically after the completion of a mutually exclusive access from the hardware based co-simulation platform, any of the data modified by the hardware based co-simulation platform is transferred from the hardware representation to the software representation.

The transferring of the data for the memory block between the hardware and software representations may use a burst data transfer to accomplish efficient data transfer. In one embodiment, the modified data may be transferred by unconditionally transferring all of the data for the memory block. In a second embodiment, the modified data may be transferred by transferring all of the data for the memory block if any of the data for the memory block is modified. In a third embodiment, the modified data may be transferred by transferring a contiguous range of locations for the memory block that includes all of the modified data. In a fourth embodiment, the modified data may be transferred by transferring a modification history including a sequence of pairings of location address and update value.

In an example simulation, the memory block may accessed by a producer, which writes to the memory block but does not read from the memory block, and a consumer, which reads from the data block but does not write to the memory block. If the producer is a block simulated on the software platform and the consumer is a block simulated on hardware based co-simulation platform, step 950 need only transfer data from the software representation to the hardware representation. Conversely, if the producer is a block simulated on the hardware based co-simulation platform and the consumer is a block simulated on software platform, step 950 need only transfer data from the hardware representation to the software representation.

The present invention is thought to be applicable to a variety of systems for hardware co-simulation and particularly applicable and beneficial in efficient hardware co-simulation for high data bandwidth applications, such as video processing. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for processing a circuit design, comprising:
generating in the circuit design in response to user input control, a first block, a second block, a shared memory, and a third block;
coupling, in response to user input control, the first block to the second block, the second block to the shared memory, and the shared memory to the third block;
accessing the shared memory by the second block during a simulation of the circuit design in response to the first block, wherein a set of a plurality of scalar values is accessed by a corresponding plurality of scalar accesses during one cycle of the simulation;
transferring the set of scalar values between the second block and the first block during one cycle of the simulation; and
accessing the shared memory by the third block during the simulation of the circuit design by another corresponding plurality of scalar accesses.

2. The method of claim 1, wherein the set of scalar values is one of: a vector, a multidimensional matrix, and a frame defined in the first block.

3. The method of claim 2, wherein the second block is a vector-write block, the transferring the set of scalar values comprises transferring the set of scalar values from the first block to the vector-write block, and the accessing the shared memory by the second block comprises writing the set of the scalar values to the shared memory.

4. The method of claim 3, wherein the third block is a vector-read block.

5. The method of claim 4, wherein the coupling the second block to the shared memory and the shared memory to the third block includes providing a parameter value to each of the vector-write block and the vector-read block linking the vector-write block and the vector-read block to the shared memory.

6. The method of claim 5, wherein the parameter value is a name for the shared memory.

7. The method of claim 3, wherein the vector-write block determines from the set of scalar values a type for the scalar values and dimensions of a data structure for the scalar values.

8. The method of claim 2, wherein the second block is a vector-read block, the accessing the shared memory by the second block comprises reading the set of the scalar values from the shared memory, and the transferring the set of scalar values comprises transferring the set of scalar values from the vector-read block to the first block.

9. The method of claim 8, wherein the third block is a vector-write block.

10. The method of claim 9, wherein the coupling the second block to the shared memory and the shared memory to the third block includes providing a parameter value to each of the vector-read block and the vector-write block linking the vector-read block and the vector-write block to the shared memory.

11. The method of claim 10, wherein the parameter value is a name for the shared memory.

12. The method of claim 8, wherein the vector-read block has parameters specifying a type for the scalar values, dimensions of a data structure for the set of scalar values, and an interval during the simulation of the circuit design between transfers of the set of scalar values.

13. The method of claim 1 further comprising formatting by the second block the set of the scalar values into a data structure of non-scalar data during simulation of the circuit design.

14. The method of claim 1, wherein the transferring of the set of scalar values during the one simulation cycle transfers the set of scalar values between a software-based co-simulation platform and a hardware-based co-simulation platform.

15. The method of claim 14, wherein the transferring the set of scalar values between the software-based co-simulation platform and the hardware-based co-simulation platform uses a burst transfer of the set of the scalar values.

16. A co-simulation system comprising:
a hardware-based co-simulation platform adapted to simulate a shared memory and a first block, wherein the simulation of the first block causes a plurality of scalar values of non-scalar data to be read to or written from the shared memory; and
a software-based co-simulation platform coupled to the hardware-based co-simulation platform, the software-based co-simulation platform-adapted to simulate a second block and a third block, wherein the simulation of the third block transfers the non-scalar data from the second block to the shared memory in the hardware-based co-simulation platform or from the shared memory to the second block in a single simulation cycle.

17. A simulation system comprising:
means for generating in the circuit design in response to user input control, a first block, a second block, a shared memory, and a third block;
means for coupling, in response to user input control, the first block to the second block, the second block to the shared memory, and the shared memory to the third block;
means for accessing the shared memory by the second block during a simulation of the circuit design in response to the first block, wherein a set of a plurality of scalar values is accessed by a corresponding plurality of scalar accesses during one cycle of the simulation;
means for transferring the set of scalar values between the second block and the first block during one cycle of the simulation; and
means for accessing the shared memory by the third block during the simulation of the circuit design, wherein each access to the shared memory by the third block has means for accessing a scalar value.

* * * * *